(12) United States Patent
Liu et al.

(10) Patent No.: US 11,521,928 B2
(45) Date of Patent: Dec. 6, 2022

(54) REDUCING STRESS CRACKS IN SUBSTRATES

(71) Applicant: SEMICONDUCTOR COMPONENTS INDUSTRIES, LLC, Phoenix, AZ (US)

(72) Inventors: Yong Liu, Cumberland Foreside, ME (US); Stephen St. Germain, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 87 days.

(21) Appl. No.: 17/247,094

(22) Filed: Nov. 30, 2020

(65) Prior Publication Data
US 2022/0173049 A1 Jun. 2, 2022

(51) Int. Cl.
*H01L 23/532* (2006.01)
*H01L 21/768* (2006.01)
*H01L 23/00* (2006.01)

(52) U.S. Cl.
CPC .. *H01L 23/53238* (2013.01); *H01L 21/76834* (2013.01); *H01L 24/29* (2013.01)

(58) Field of Classification Search
CPC ......... H01L 23/53238; H01L 21/76834; H01L 24/29
See application file for complete search history.

(56) References Cited

U.S. PATENT DOCUMENTS

| | | | | |
|---|---|---|---|---|
| 10,008,472 B2 * | 6/2018 | Talledo | ................. | H01L 21/561 |
| 2002/0145180 A1 * | 10/2002 | Terui | ....................... | H01L 24/32 |
| | | | | 257/676 |
| 2008/0164588 A1 * | 7/2008 | Lee | .................... | H01L 23/3107 |
| | | | | 257/668 |

OTHER PUBLICATIONS

Xu, Ling et al., "DBC Substrate in Si- and SiC-based Power Electronics Modules: Design, Fabrication and Failure Analysis", May 2013, In 2013 IEEE 63rd Electronic Components and Technology Conference, pp. 1341-1345.
Douglas C. Hopkins, Ph.D., "Excerpt—Direct Bonded Copper", 2003, Courtesy of Curamic Electronics, 35 pages.

* cited by examiner

*Primary Examiner* — Karen Kusumakar
(74) *Attorney, Agent, or Firm* — Brake Hughes Bellermann LLP

(57) ABSTRACT

Implementations described herein are related to an improved semiconductor device package for providing an electrical connection between one or more semiconductor die and one or more substrates. The one or more substrates includes a dielectric layer having a first side and a second side opposite the first side, and a first metal layer bonded to the first side of the dielectric layer, the first metal layer having a first portion and a second portion. The semiconductor device package can also include a semiconductor die disposed onto the first metal layer within the first portion of the first metal layer. In some implementations, the one or more conducting substrates includes a direct bonded copper (DBC) substrate, i.e., the metal is copper.

20 Claims, 8 Drawing Sheets

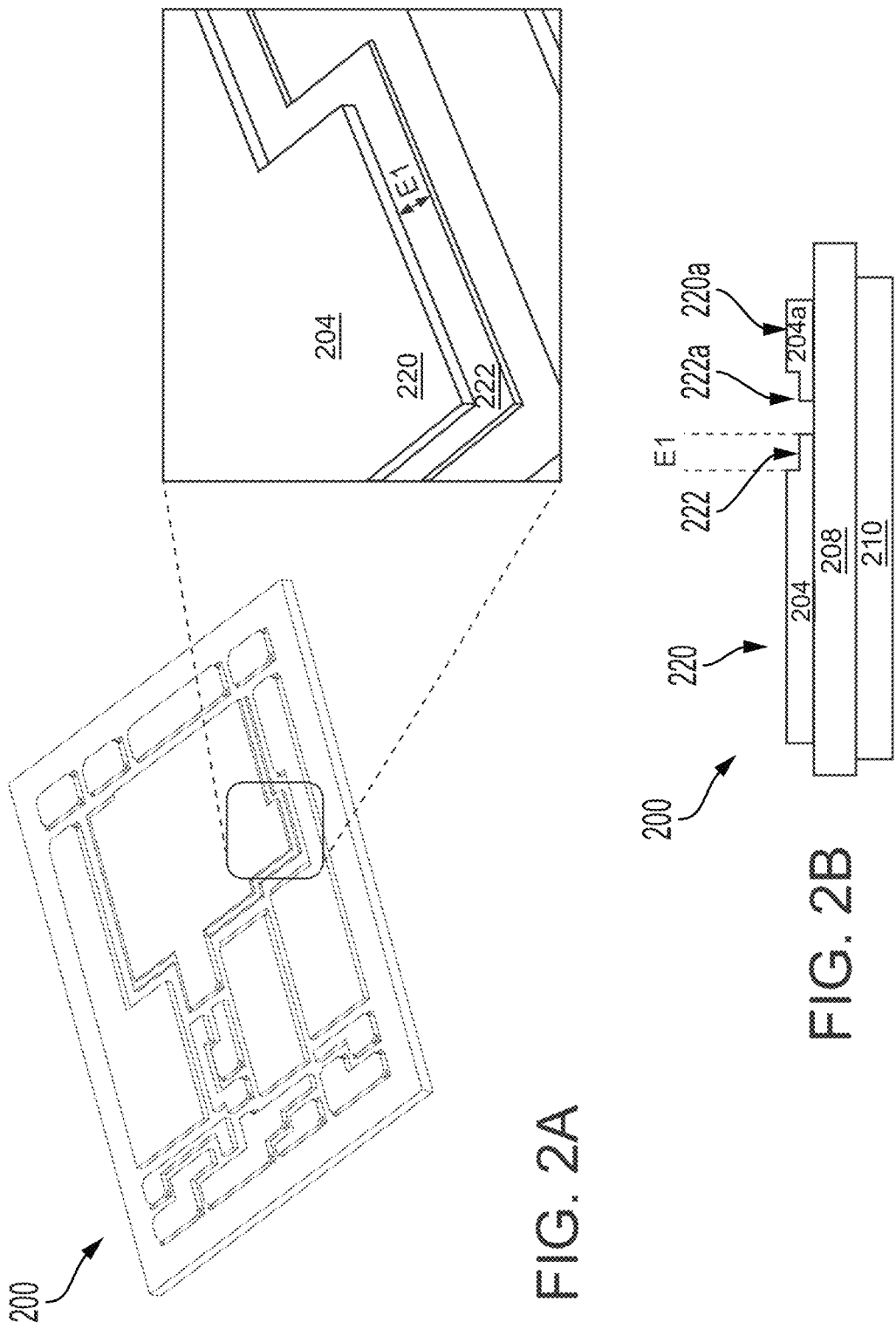

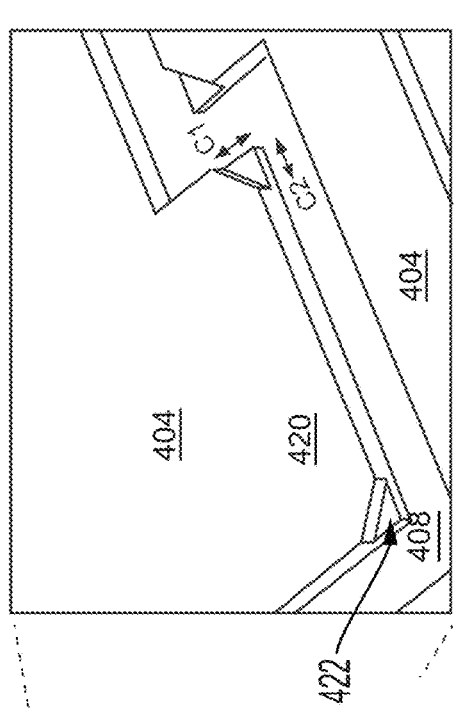
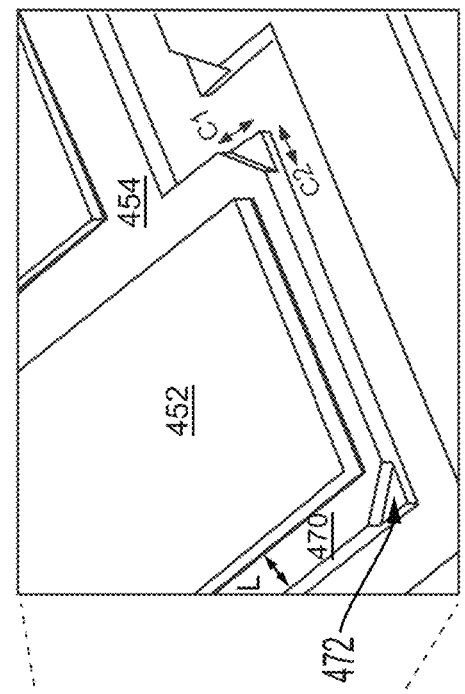
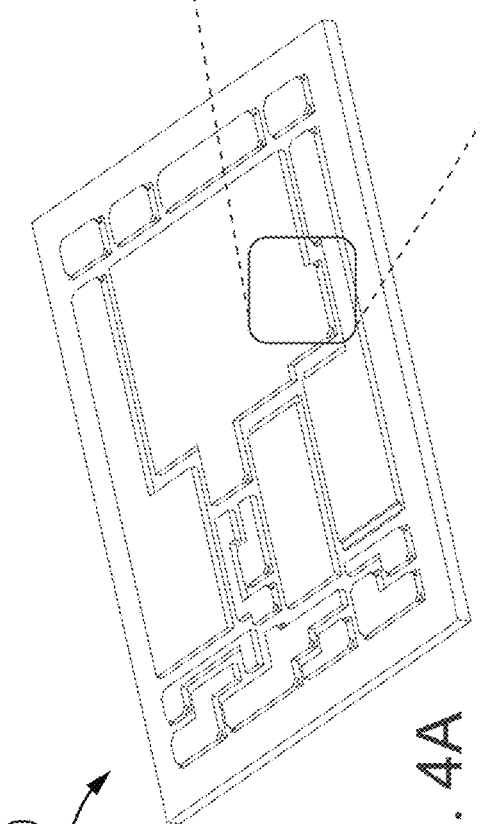
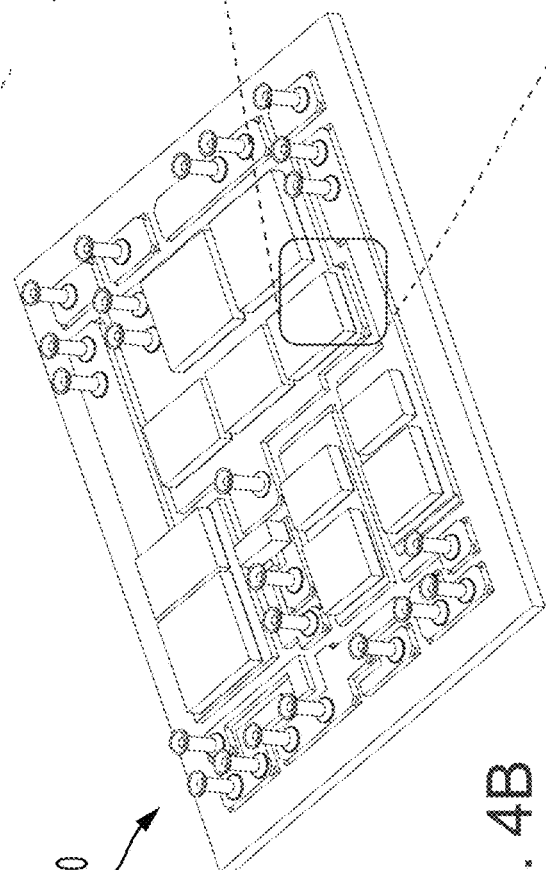
FIG. 4A
FIG. 4B

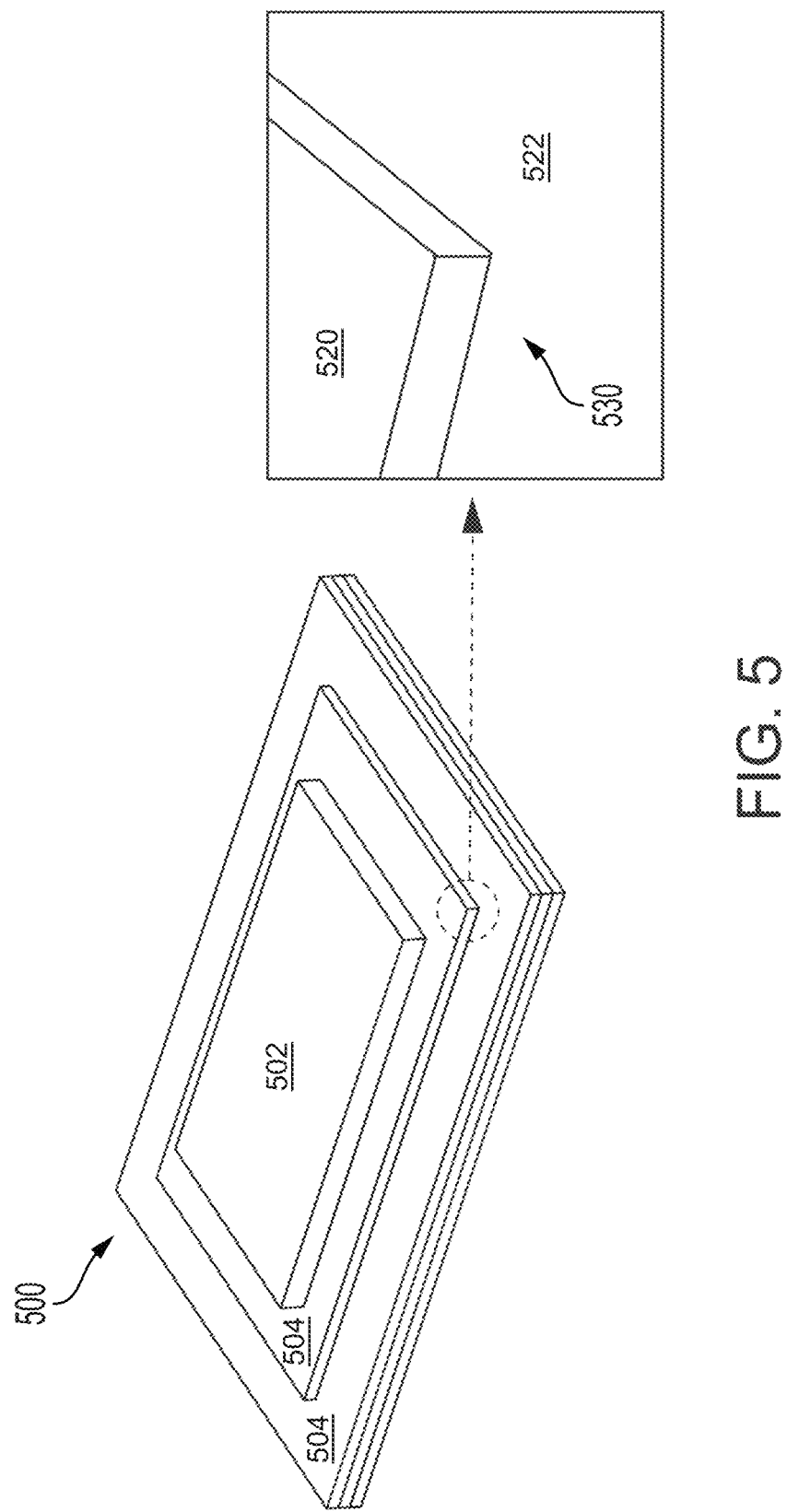

REDUCING STRESS CRACKS IN SUBSTRATES

TECHNICAL FIELD

This description relates to devices and methods for reducing stress cracks in substrates in electronic power modules.

BACKGROUND

The role of a substrate in some high-power electronics is to provide interconnections to form an electric circuit (e.g., a printed circuit board) and to cool its components. Such substrates usually carry higher currents and provide a higher voltage isolation than materials and techniques used in lower power microelectronics. These substrates also operate over a range of relatively high temperatures, e.g., 150° C. to 200° C.

SUMMARY

In one general aspect, a semiconductor device package can include a substrate for a power module. The substrate can include a dielectric layer having a first side and a second side opposite the first side, and a first metal layer bonded to the first side of the dielectric layer, the first metal layer having a first portion and a second portion. The semiconductor device package can also include a semiconductor die disposed onto the first metal layer within the first portion of the first metal layer. The first portion of the first metal layer has a first thickness with respect to the dielectric layer, the second portion of the first metal layer has a second thickness with respect to the dielectric layer, the second thickness is greater than zero but less than the first thickness.

In another general aspect, a method can include receiving a substrate for a power module, the substrate including a dielectric layer having a first side and a second side opposite the first side; and a first metal layer bonded to the first side of the dielectric layer. The method can also include performing a first etch operation on a first portion of the first metal layer to produce a first etched portion of the first portion of the metal layer, the first etched portion having a first thickness. The method can further include disposing a connecting clip on the first material stack and the second material stack, the connecting clip including a first portion disposed on the first material stack and a second portion disposed on the second material stack. The method can further include performing a second etch operation on the first etched portion of the first portion of the metal layer to produce a second etched portion of the first portion of the metal layer, the second etched portion having a second thickness, the second thickness being less than the first thickness.

The details of one or more implementations are set forth in the accompanying drawings and the description below. Other features will be apparent from the description and drawings, and from the claims.

BRIEF DESCRIPTION OF THE DRAWINGS

FIG. 2A is a diagram that illustrates a skew view of an example improved semiconductor device package.

FIG. 2B is a diagram that illustrates a side view of the example improved semiconductor device package.

FIG. 4A is a diagram that illustrates a skew view of an example improved semiconductor device package with cornered sidewalls on the metal layer portion onto which the semiconductor die may be disposed.

FIG. 4B is a diagram that illustrates a skew view of the example improved semiconductor device package with cornered sidewalls on the metal layer portion onto which the semiconductor die is disposed.

FIG. 5 is a diagram that illustrates a skew view of the example improved semiconductor device package with right-angled corners on the metal layer portion onto which the semiconductor die is disposed.

DETAILED DESCRIPTION

Figure 1A:
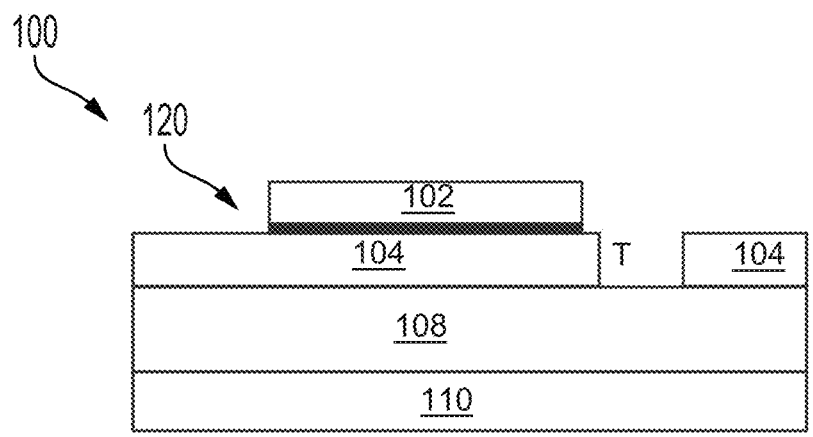
FIG. 1A is a diagram that illustrates a side view of an example semiconductor device package that includes a substrate with a metal on either side.

One type of substrate that can be used in power modules are Direct Bonded Copper (DBC) substrates. One example of such a DBC substrate uses a dielectric such as an alumina ceramic. Accordingly, DBC substrate structures provide a wide temperature range for operation and electrical isolation in power packages as that described above. Moreover, DBC substrates also have a low coefficient of thermal expansion (CTE).

DBC substrates may have a copper layer on one or both sides of the alumina dielectric. The copper may be bonded to one or both sides by a high-temperature oxidation process. The top copper layer can be chemically etched using printed circuit board technology to define one or more traces that can be used to form an electrical circuit, while the bottom copper layer can be unpatterned. In some implementations, the substrate is attached to a heat spreader by soldering the bottom copper layer to it.

Although many of the implementations are discussed in the context of DBC's any of the implementations described herein can be broadly applied to any type of direct bonded metal (DBM) substrate that can include a variety of dielectrics (e.g., alumina dielectric) and/or metal types including copper and/or another metal. In some implementations, substrates for power modules include a layer of dielectric onto which a metal layer, e.g., copper is bonded; the metal layer is then patterned and a semiconductor die is disposed upon a portion of a patterned metal layer. Moreover, conventional approaches to fabricating a substrate for power modules includes performing an etch operation on a metal layer disposed on a dielectric layer to produce a patterned metal layer onto which a die may be soldered. In some implementations, the substrate is a DBC substrate and the metal is copper. In some implementations, the metal includes aluminum.

In some applications, the voltages applied to a power module using a DBC substrate may be 100 V or higher. Such high voltages can cause large currents and, consequently, high temperatures. These high temperatures, which may be outside of the typical temperature range over which the DBC substrate operates, may cause structural problems with the DBC substrate. For example, the die structure and solder attach on a DBC surface have different coefficients of thermal expansion (CTEs). At the high temperatures induced by the high voltages seen in a power module, the above-described conventional approaches to fabricating a DBC substrate may result in cracks between the DBC and dielectric layer structure during assembly and test.

One technique to reduce stress in DBC substrates includes fabricating dimple-shaped holes into the copper layer. Such dimples are introduced as a form of a mold lock but were found to reduce stress cracking in the copper. Nevertheless, the dimple-shaped holes can occupy an excessive amount of space on the substrate (e.g., requiring at least a 0.7 mm gap between the semiconductor die and a DBC metal corner).

In contrast to the above-described substrates for power modules, the implementations described herein are related to an improved semiconductor device package for providing an electrical connection between one or more semiconductor die and one or more substrates. The one or more substrates includes a dielectric layer having a first side and a second side opposite the first side, and a first metal layer bonded to the first side of the dielectric layer, the first metal layer having a first portion and a second portion. The semiconductor device package can also include a semiconductor die disposed onto the first metal layer within the first portion of the first metal layer. In some implementations, the one or more conducting substrates includes a direct bonded copper (DBC) substrate, i.e., the metal is copper.

An improved substrate of the semiconductor device package, as described herein, has the first portion of the first metal layer having a first thickness with respect to the dielectric layer, the second portion of the first metal layer having a second thickness with respect to the dielectric layer, and the second thickness being greater than zero but less than the first thickness. An improved technique for fabricating a semiconductor device package includes creating a first portion a second portion of a first metal layer using a lithographic process. In an example lithographic process, a lithographic process assembly deposits a layer of photoresist onto the first metal layer of the substrate, and a pattern transfer device, e.g., a photolithography scanner, illuminates the layer of photoresist with an illumination pattern based on a first reticle such that a subsequent develop process defines the first portion. Subsequently, the substrate is moved to an etching assembly, which removes some of the metal in the first portion as defined by the lithographic process to produce a first thickness of the metal within the first portion. To define the second portion of the first metal layer, the lithographic process is repeated, but with a second reticle corresponding to the pattern of the exposed dielectric. The subsequent etch process removes the rest of the metal to expose the dielectric and define the second portion of the first metal layer having the second thickness.

In some implementations, the improved substrate of the semiconductor package assembly can have the second portion of the first metal layer laterally surrounding the first portion of the metal layer. In some implementations, the first portion has a recess (e.g., which can include a cutout in the sidewall and top, can include removal of a volume of material). In some implementations, the recess is at a respective corner of the material. In some implementations, the second portion of the first metal layer extends beyond (e.g., protrudes beyond) the first portion of the first metal layer only outside of the respective corner defined by the recess of the first portion of the first metal layer. In some implementations, the respective corner defined by the recess of the first portion of the first metal layer defines a straight line connected to adjacent edges at obtuse angles. In some implementations, a distance across a surface of the second portion of the first metal layer protruding beyond the respective corner is between about 0.3 mm and 0.7 mm. In some implementations, the at least the respective corner defined by the recess of the first portion of the first metal layer defines a rounded edge.

In some implementations, the second thickness is about half of the first thickness. In some implementations, the second thickness is greater than half of the first thickness. In some implementations, the second thickness is less than half of the first thickness. In some implementations, the first portion of the first metal layer has an essentially vertical sidewall, the second portion of the first metal layer has an outer edge adjacent to a gap in the first metal layer, and a distance between the essentially vertical sidewall of the first portion and the outer edge of the second portion along a surface of the second portion is between about 0.3 mm and 0.7 mm.

The improved substrate of the semiconductor device package as described above is advantageous over conventional substrates. The recessed (e.g., stair-step) structure of such improved substrates reduces or eliminates stress cracks in the isolate layer (e.g., ceramic due to the recessed structure that may effectively change the equivalent CTE mismatch between dielectric layer and metals. Moreover, the recessed (e.g., stair-step) structure is more compact than other designs (e.g., dimple-shaped holes) and allows for less material and smaller device size.

FIG. 1A is a diagram that illustrates a side view of a substrate 100 with a metal on either side. As shown in FIG. 1A, the semiconductor package assembly 100 includes a semiconductor die 102, a first metal layer 104, a dielectric layer 108, and a second metal layer 110.

The substrate 100 is configured to carry electrical current from a semiconductor die (e.g., semiconductor die 102) to a connection outside of a semiconductor package assembly (e.g., a printed circuit board, not pictured) that includes the substrate 100. In some implementations, the substrate 100 includes direct bonded copper (DBC). A DBC may be composed of a ceramic tile (e.g., alumina) with a layer (e.g., sheet) of copper bonded to one or both sides. The layer can be formed by, for example, a high-temperature oxidation process. A DBC may be desirable for use in power electronics because of, for example, its low coefficient of thermal expansion (CTE).

As shown in FIG. 1A, the substrate 100 has disposed on it a semiconductor die 102. In some implementations, the semiconductor die 102 is a functional electronic device previously cut (e.g., singulated) from a semiconductor wafer (e.g., Si, GaAs, SiGe, etc.). The semiconductor die 102 includes a set of layers connected to each other via vertical (or substantially vertical) interconnects. For example, the set of layers can include one or more metal layers, a gate layer, and one or more via layers.

There is electrically conducting bond between the semiconductor die 102 and the first metal layer 104. For example, when the first metal layer 104 is a copper layer, the electrically conducting bond is a solder joint. Other types of metal may also be bonded to the semiconductor die 102 with solder.

As shown in FIG. 1A, the first metal layer 104 onto which the semiconductor die 102 is coupled, is patterned. The patterning of the first metal layer produces a space in the first metal layer through which the dielectric of the dielectric layer 108 is exposed. While the space appears as a straight line in the side view shown in FIG. 1A, the actual pattern of the first metal layer 104 on the dielectric layer 102 is more complex as shown in FIG. 1B.

Also shown in FIG. 1A is a second metal layer 110 on a side of the dielectric layer 108 opposite that on which the first metal layer 104 is bonded. While the second metal layer 110 may not always be included in all such substrates 100, the second metal layer 110 provides improved heat spreading over the substrate 100.

Figure 1B:
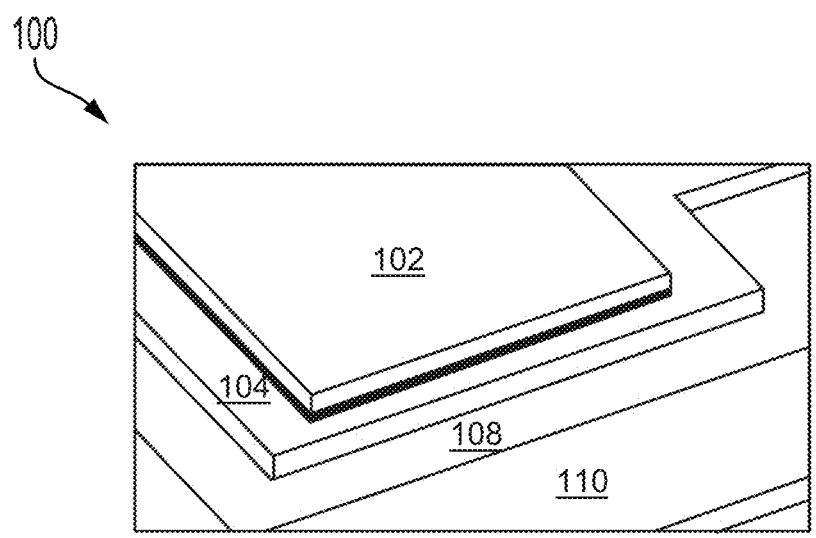
FIG. 1B is a diagram that illustrates a skew view of the example semiconductor device package.

FIG. 1B is a diagram that illustrates a skew view of the substrate 100 showing the patterning of the metal layer 104 over the dielectric layer 108. A technique for fabricating a semiconductor device package includes using a lithographic process to define the patterning of the first metal layer 104. In an example lithographic process, a lithographic process assembly deposits a layer of photoresist onto the first metal layer of the substrate, and a pattern transfer device, e.g., a photolithography scanner, illuminates the layer of photoresist with an illumination pattern based on a reticle such that a subsequent develop process defines the patterning. Subsequently, the substrate is moved to an etching assembly, which removes some of the metal in the first portion as defined by the lithographic process to produce the patterned first metal layer 104. This in turn defines the geometry of the spaces through which the dielectric layer 108 is exposed.

Because the dielectric underneath the copper layer 104 is subject to stress cracks at high temperatures, the solder used to bond the semiconductor die 102 to the metal layer 104 may reflow through the cracks induced by the high temperature. This may place conductive solder material in areas that may cause a short upon using the resulting semiconductor device package in a circuit.

Figure 1C:
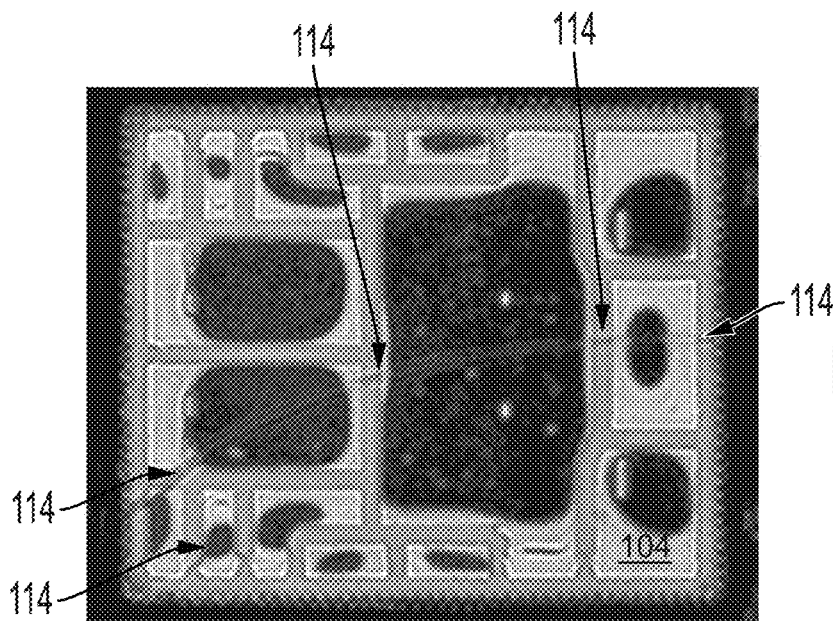
FIG. 1C is a diagram that illustrates a top view of a portion of an example processed semiconductor device package illustrating cracks in the metal due to high temperatures induced by an application of high voltages.

FIG. 1C is a diagram that illustrates a top view of a portion of the processed semiconductor device package 100 illustrating stress cracks 114 in the metal due to high temperatures induced by an application of high voltages. The stress cracks 114 in the ceramic layer as shown in FIG. 1C may allow for solder reflow across the spaces defining the dielectric layer, thus creating electrical connections between copper regions that can cause an unwanted electrical short.

FIG. 2A is a diagram that illustrates a skew view of a semiconductor device package 200. As shown in FIG. 2A, a small region of the semiconductor device package 200 is illustrated in an exploded view to show a region of an improved substrate.

The exploded view shows the substrate having a first metal layer 204 and a trench exposing a dielectric layer 208. The first metal layer 204 has two portions 220 and 222. The first portion 220 is configured to be coupled to a semiconductor die (not shown) using, e.g., solder.

As illustrated in FIG. 2A, the second portion 222 of the first metal layer 204 surrounds the first portion 220 of the first metal layer 204, which may correspond to a single semiconductor die to be coupled to the first metal layer. In some implementations, an edge of the second portion 222 surrounding the first portion 220 extends beyond an edge or corner of a sidewall of the first portion 220 by a distance labeled as E1 in FIG. 2A. In some implementations, the distance E1 is between 0.3 mm and 0.7 mm, which advantageously compares with the amount of metal needed for the above-described dimple-shaped holes.

FIG. 2B is a diagram that illustrates a side view of the substrate of the semiconductor device package 200. In addition to the first metal layer 204, FIG. 2B shows the first metal layer 204 disposed on the dielectric layer 208, and the dielectric layer 208 disposed on a second metal layer 210. The purpose of the second metal layer 210 is to provide an improved heat spreading over the substrate over a substrate not including such a second metal layer. In a DBC substrate, the second metal layer 210 includes copper.

FIG. 2B also shows the first portion 220 and second portion 222 of the first metal layer 204. Note also that another metal feature 204a has a similar first portion and second portion according to the above-described improved techniques. In some implementations, the distance E1 associated with the first metal layer 204 is used for every metal feature including 204a. In some implementations, the distance E1 may depend on feature-specific properties, e.g., the nature of the semiconductor die to be bonded to the top surface of that feature.

The first portion 220 has a thickness T1 with respect to the dielectric layer 208 (e.g., from a top surface 212 of the dielectric layer 208). The second portion 222 has a second thickness T2 with respect to the dielectric layer 208 (e.g., from the top surface 212 of the dielectric layer 208). As shown in FIG. 2B, the second thickness is less than the first thickness but is greater than zero. Electrical traces (not shown) are formed within the first portion 220 and generally have a thickness of T1. The electrical traces can be formed by fully recessing areas (e.g., channels) around the electrical traces down to the dielectric layer 208 (with a thickness of zero (which is less than thickness T2)). In some implementations, the second thickness is about half of the first thickness to within measurement and fabrication errors. In some implementations, the first thickness is between 0.2 mm and 1.0 mm. In some implementations, the second thickness is between 0.1 mm and 0.5 mm. In some implementations, the first thickness and/or the second thickness is based on CTE mismatch degree of metal and dielectric layer in the substrate and the power that the package may dissipate. In some implementations, the first thickness is greater than the distance E1.

Figures 3A, 3B:
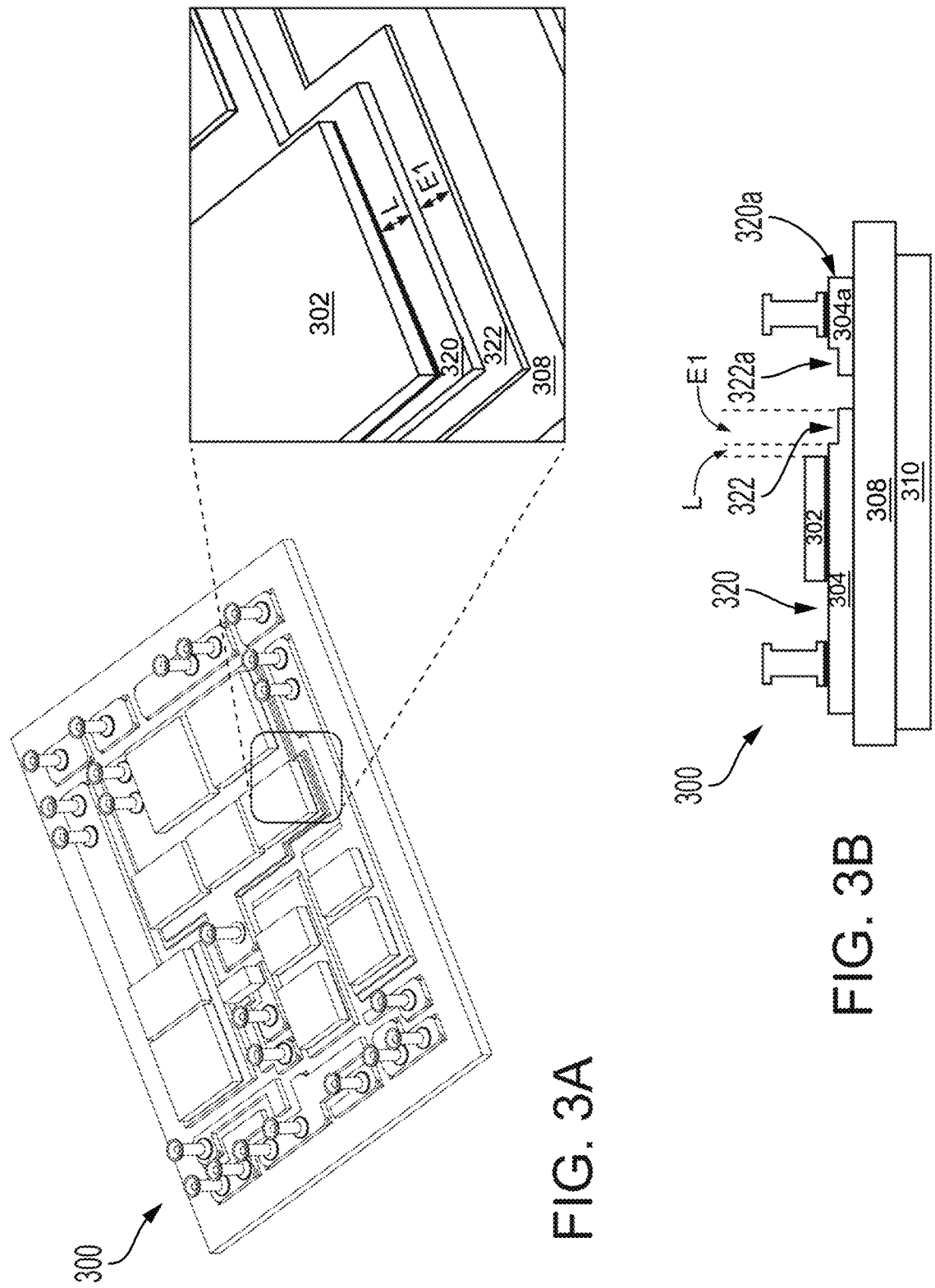
FIG. 3A is a diagram that illustrates a skew view of an example improved semiconductor device package with a semiconductor die bonded to the metal layer.
FIG. 3B is a diagram that illustrates a side view of the example improved semiconductor device package with a semiconductor die bonded to the metal layer.

FIG. 3A is a diagram that illustrates a skew view of semiconductor device package 300 with a semiconductor die 302 bonded to the metal layer 304 of an improved substrate. As shown in FIG. 3A, a small region of the semiconductor device package 300 is illustrated in an exploded view to show a region of the improved substrate.

The exploded view shows the substrate having a first metal layer 304 and a trench exposing a dielectric layer 308. The first metal layer 304 has two portions 320 and 322.

As illustrated in FIG. 3A, the second portion 322 of the first metal layer 304 surrounds the first portion 320 of the first metal layer 304, which has the semiconductor die 302 to bonded to it. In some implementations, an edge of the second portion 322 surrounding the first portion 320 extends beyond an edge or corner of a sidewall of the first portion 320 by the distance labeled as E1 in FIG. 3A, which is the same E1 as shown in FIG. 2A.

It is also noted that a distance from an edge of the semiconductor die 302 to an edge or corner of the first portion 320 is denoted as L in FIG. 3A. Values of the distance L as shown in FIG. 3A are about the same as those used in alternative fabrication schemes, e.g., dimple-shaped holes. Accordingly, a semiconductor device package having the improved substrate may be made significantly smaller than a semiconductor device package having dimple-shaped holes to counteract stress cracks in the metal layer.

Also shown in FIG. 3A on the semiconductor package device 300 are various pins bonded to first metal layers in place of, or in addition to, the semiconductor dies. The pins are used to connect the substrate bonded to the semiconductor dies with an external electronic component, e.g., a printed circuit board (PCB) assembly.

FIG. 3B is a diagram that illustrates a side view of the semiconductor device package 300 with a semiconductor die bonded to the metal layer. In addition to the first metal layer 304, FIG. 3B shows the first metal layer 304 disposed on the dielectric layer 308, and the dielectric layer 308 disposed on a second metal layer 310. The purpose of the second metal layer 310 is to provide an improved heat spreading over the substrate over a substrate not including such a second metal layer. In a DBC substrate, the second metal layer 310 includes copper.

FIG. 3B also shows the first portion 320 and second portion 322 of the first metal layer 304. Note also that another metal feature 304a has a similar first portion and second portion according to the above-described improved techniques. In some implementations, the distance E1 associated with the first metal layer 304 is used for every metal feature including 304a. In some implementations, the distance E1 may depend on feature-specific properties, e.g., the nature of the semiconductor die and/or pins bonded to the top surface of that feature.

The first portion 320 has a thickness T1 with respect to the dielectric layer 308 (e.g., from a top surface 312 of the dielectric layer 308). The second portion 322 has a second thickness T2 with respect to the dielectric layer 308 (e.g., from the top surface 212 of the dielectric layer 208 of FIG. 2B). As shown in FIG. 2B, the second thickness T2 is less than the first thickness T1 but is greater than zero. Traces, e.g., as in a printed circuit board (PCB), are recesses of zero thickness. In some implementations, the second thickness T2 is about half of the first thickness T1 to within measurement and fabrication errors. In some implementations, the first thickness T1 is between 0.2 mm and 1.0 mm. In some implementations, the second thickness T2 is between 0.1 mm and 0.5 mm. In some implementations, the first thickness T1 and/or the second thickness T2 is based on CTE mismatch degree of metal and dielectric layer in the substrate and the power that the package may dissipate. In some implementations, the first thickness T1 is greater than the distance E1.

FIG. 4A is a diagram that illustrates a skew view of a semiconductor device 400 package with cornered sidewalls on the metal layer portion 420 onto which a semiconductor die may be disposed. As shown in FIG. 4A, a small region of the semiconductor device package 400 is illustrated in an exploded view to show a region of the improved substrate.

The exploded view shows the substrate having a first metal layer 404 and a trench exposing a dielectric layer 408. The first metal layer 404 has two portions 420 and 422. The first portion 420 has a first thickness with respect to the dielectric layer 408 and is configured to be bonded to a semiconductor die using, e.g., solder. The second portion 422 has a second thickness with respect to the dielectric layer 408. As shown in FIG. 4A, the second thickness is less than the first thickness but is greater than zero. In some implementations, the second thickness is about half of the first thickness to within measurement and fabrication errors.

As illustrated in FIG. 4A, the second portion 422 of the first metal layer 404 surrounds the first portion 420 of the first metal layer 404. In some implementations, an edge of the second portion 422 surrounding the first portion 420 extends beyond a corner of a sidewall of the first portion 420 by triangular-shaped regions defining the second portion 422. The triangular-shaped region is characterized by the length of its sides C1 and C2 as shown in FIG. 4A. In some implementations, the values of sides C1 and C2 are between 0.2 mm and 1.0 mm. In some implementations, C1 is different from C2. In this case, however, the amount of space taken up by the second portion 422 is reduced (e.g., minimal) because the second portion 422 includes only those triangular regions and no other extension beyond the first portion 420.

Also shown in FIG. 4A on the semiconductor package device 400 are various pins bonded to first metal layers in place of, or in addition to, the semiconductor dies. The pins are used to connect the substrate bonded to the semiconductor dies with an external electronic component, e.g., a printed circuit board (PCB) assembly.

FIG. 4B is a diagram that illustrates a skew view of a semiconductor device package 450 with cornered sidewalls on the metal layer portion onto which the semiconductor die is disposed. FIG. 4B is similar to FIG. 4A except that is illustrates the first metal layer 454 having a semiconductor die 452 bonded to its surface. The first metal layer 454 has a first portion 470 and a second portion 472. Again, the second portion 472 only includes triangular shaped regions having sides C1 and C2. In this case the distance between an edge of the semiconductor die 452 and a long edge of the first portion 470 is L.

FIG. 5 is a diagram that illustrates a skew view of a semiconductor device package substrate 500 with corners (e.g., right-angled corners) on a first portion of the metal layer 504 onto which a semiconductor die 502 is disposed. A right-angled corner 530 of the first portion 520 is shown in an exploded view in FIG. 5. Note that the sidewalls of the first portion 520 are essentially vertical to within measurement and fabrication error. In some implementations, the angle of the corners is different from a right angle, e.g., is an obtuse angle. In some implementations, the distance from the edge of first portion to the edge of second portion is in the range 0.1 mm-1.0 mm, which is based on a reduction of CTE mismatch between the metal and dielectric layers.

Figure 6:
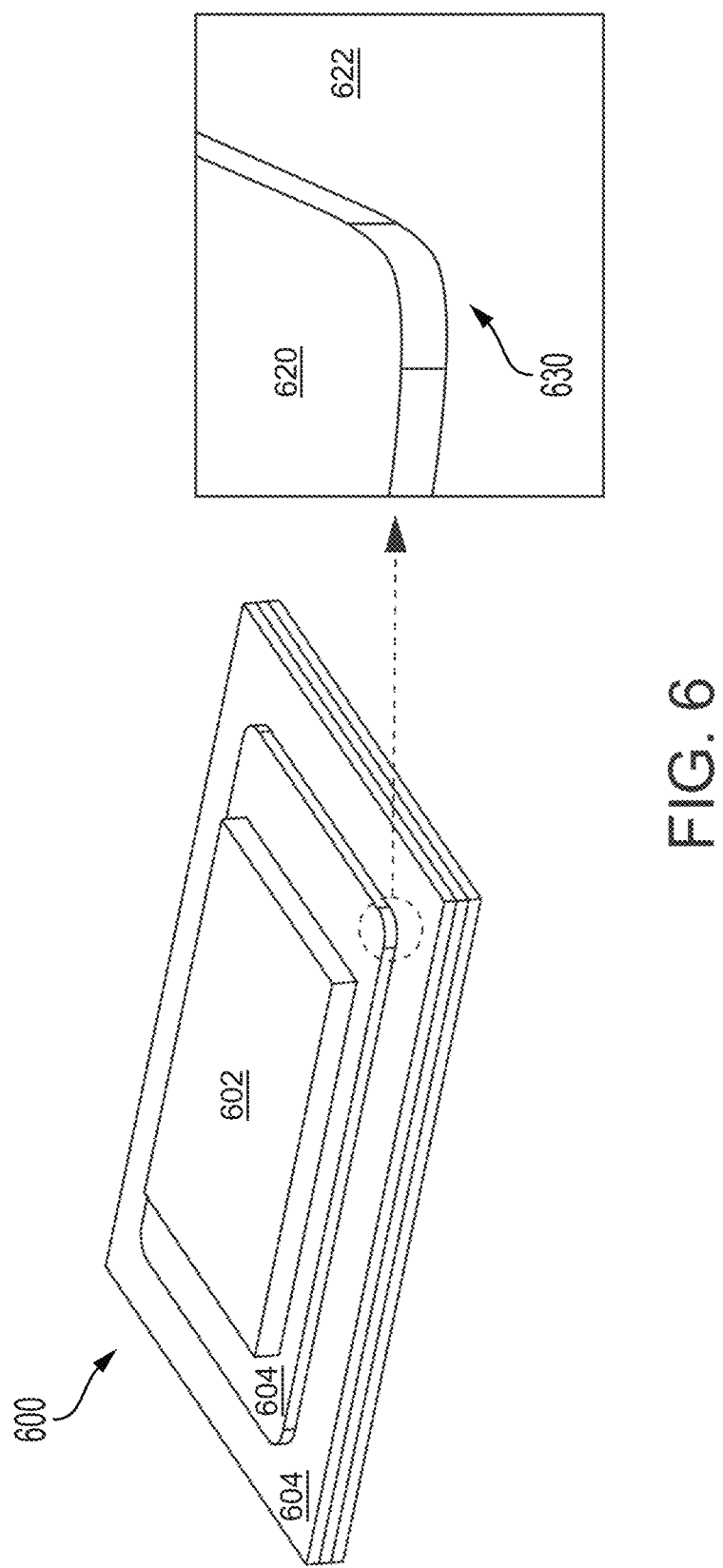
FIG. 6 is a diagram that illustrates a skew view of the example improved semiconductor device package with rounded corners on the metal layer portion onto which the semiconductor die is disposed.

FIG. 6 is a diagram that illustrates a skew view of a semiconductor device package substrate 600 with curved (e.g., rounded) corners on a first portion of the metal layer 604 onto which a semiconductor die 604 is disposed. A rounded corner 630 of the first portion 620 is shown in an exploded view in FIG. 6. Note that the sidewalls of the first portion 620 are essentially vertical to within measurement and fabrication error.

Figure 7:
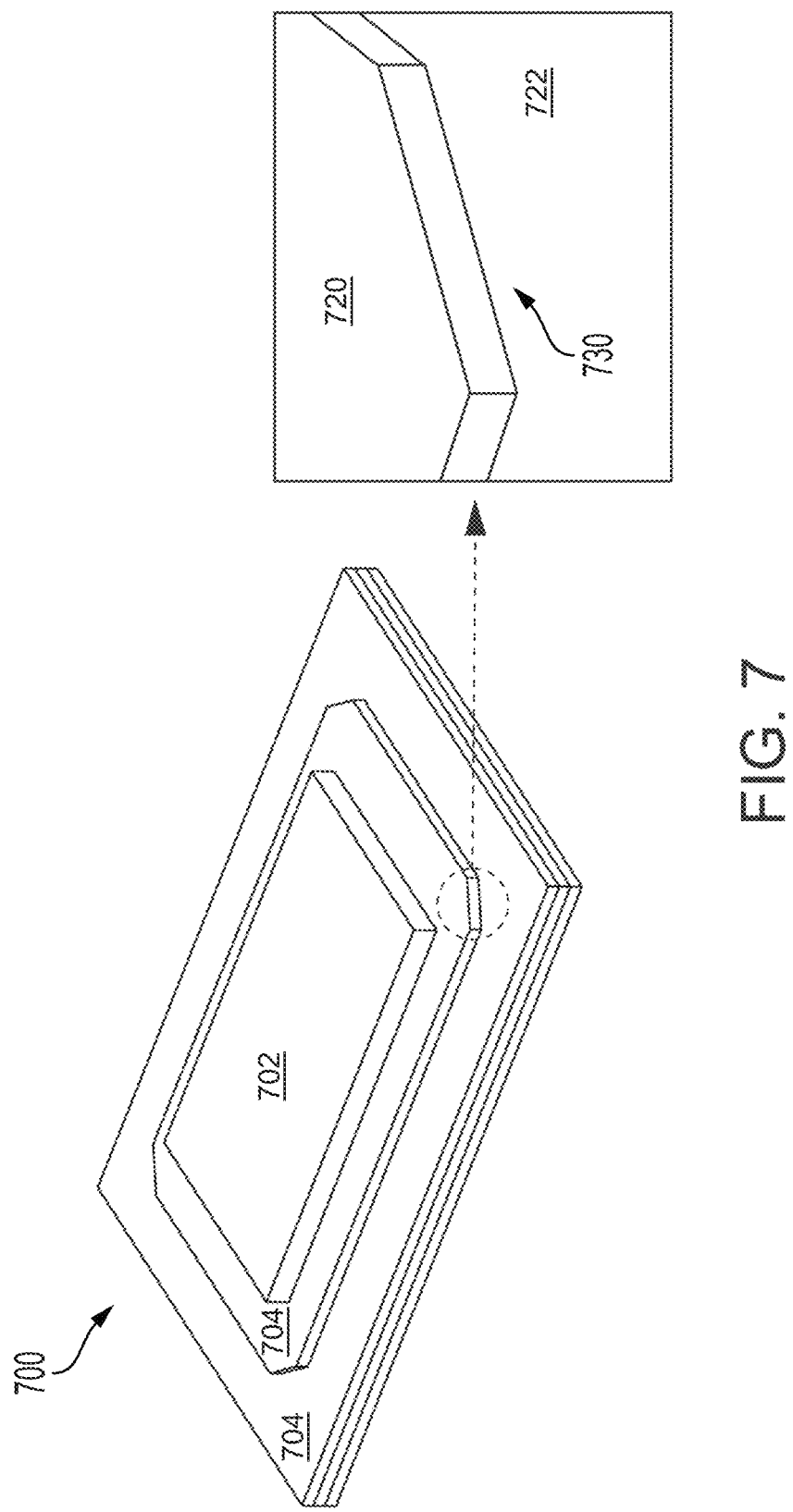
FIG. 7 is a diagram that illustrates a skew view of the example improved semiconductor device package with angled corners on the metal layer portion onto which the semiconductor die is disposed.

FIG. 7 is a diagram that illustrates a skew view of a semiconductor device package substrate 700 with obtuse-angled corners on a first portion of the metal layer 704 onto which a semiconductor die 704 is disposed. An obtuse-angled corner 730 of the first portion 720 is shown in an exploded view in FIG. 7. Note that the sidewalls of the first portion 720 are essentially vertical to within measurement and fabrication error. The obtuse-angled corner is a recess of the first portion 720 (e.g., cut in a sidewall and top at a corner of the first portion 720).

In general, the first portion of a metal layer (e.g., first portion 704) has a polygonal cross-section defining the type of corner desired. In some implementations, the polygonal cross-section defines the edges and the corners with lengths C1 and C2 are defined by at least one of those edges. While larger angles and smaller side lengths C1 and C2 may further reduce the size of a semiconductor device package, creating a polygonal cross-section with too many edges may increase a risk of mechanical stress cracks in the metal layer.

Figure 8:
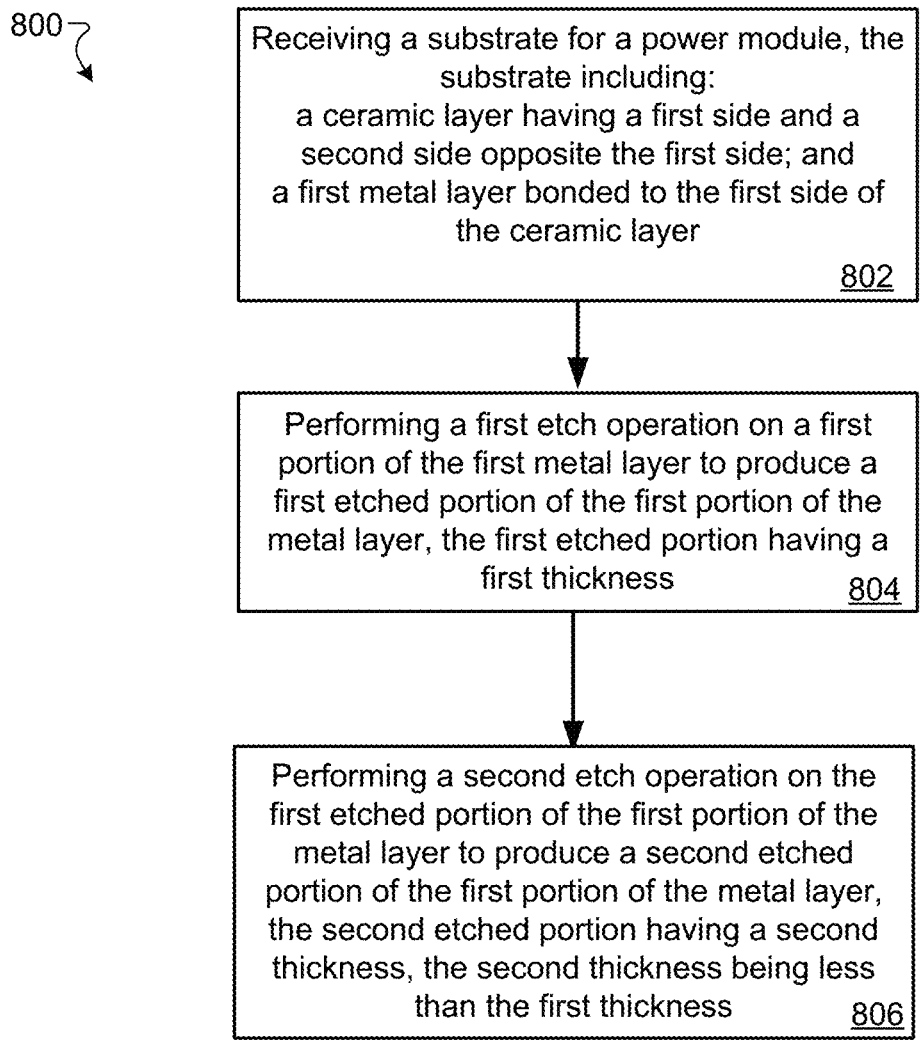
FIG. 8 is a flow chart that illustrates an example method for fabricating a substrate in a semiconductor device package according to improved techniques.

FIG. 8 is a flow chart that illustrates an example method for fabricating a substrate in a semiconductor device package according to improved techniques.

At 802, a direct bonded copper (DBC) substrate is received, the DBC substrate including a dielectric layer having a first side and a second side opposite the first side; and a first metal layer bonded to the first side of the dielectric layer.

At 804, a first etch operation is performed on a first portion of the first metal layer to produce a first etched portion of the first portion of the metal layer, the first etched portion having a first thickness.

At 806, a second etch operation is performed on the first etched portion of the first portion of the metal layer to produce a second etched portion of the first portion of the metal layer, the second etched portion having a second thickness, the second thickness being less than the first thickness.

In some implementations, fabricating a substrate may instead be a reverse process of etching by plating. That is, a first portion of the metal layer is plated with a gap to expose to the dielectric and form the second portion on the first portion of the first metal layer. In some implementations, the first portion and the second portion could be exchanged.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A semiconductor device package, comprising:
 a direct bonded metal (DBM) substrate including:
  a dielectric layer having a first side and a second side opposite the first side;
  a first metal layer bonded to the first side of the dielectric layer, the first metal layer having a first portion and a second portion, the first portion of the first metal layer having a recess; and
 a semiconductor die disposed on the first metal layer within the first portion of the first metal layer,
 the first portion of the first metal layer having a first thickness, the second portion of the first metal layer having a second thickness with respect to the dielectric layer, the second thickness being greater than zero but less than the first thickness.

2. The semiconductor device package as in claim 1, wherein the second portion of the first metal layer laterally surrounds at least a portion of the first portion of the first metal layer.

3. The semiconductor device package as in claim 1, wherein the recess is located at a corner.

4. The semiconductor device package as in claim 3, wherein the recess forms an edge of the first thickness at the corner.

5. The semiconductor device package as in claim 4, wherein the corner is a first corner; and wherein the second portion of the first metal layer protrudes beyond the first portion of the first metal layer to define a second corner of the second portion of the first metal layer.

6. The semiconductor device package as in claim 4, wherein the recess of the first portion of the first metal layer defines a straight line connected to adjacent edges at obtuse angles.

7. The semiconductor device package as in claim 6, wherein a distance across a surface of the second portion of the first metal layer extended beyond the corner is between about 0.3 mm and 0.7 mm.

8. The semiconductor device package as in claim 4, wherein the recess of the first portion of the first metal layer defines a rounded edge.

9. The semiconductor device package as in claim 1, wherein the second thickness is about half of the first thickness.

10. The semiconductor device package as in claim 1, wherein the first portion of the first metal layer has an essentially vertical sidewall, the second portion of the first metal layer has an outer edge adjacent to a gap in the first metal layer, and wherein a distance between the essentially vertical sidewall of the first portion and the outer edge of the second portion along a surface of the second portion is between about 0.3 mm and 0.7 mm.

11. The semiconductor device package as in claim 1, further comprising a second metal layer bonded to the second side of the dielectric layer.

12. A method, comprising:
receiving a direct bonded metal (DBM) substrate, the DBM substrate including:
a dielectric layer having a first side and a second side opposite the first side; and
a first metal layer bonded to the first side of the dielectric layer;
performing a first recess operation on a first portion of the first metal layer to produce a first recessed portion of the first portion of the first metal layer, the first recessed portion having a first thickness; and
performing a second recess operation on the first recessed portion of the first portion of the first metal layer to produce a second recessed portion of the first portion of the first metal layer, the second recessed portion having a second thickness, the second thickness being less than the first thickness.

13. The method as in claim 12, further comprising, prior to performing the first recess operation:
performing a lithographic pattern transfer operation to define the first recessed portion and the second recessed portion of the first portion of the first metal layer.

14. The method as in claim 12, wherein the first recessed portion of the first portion of the first metal layer has a recess at a corner.

15. The method as in claim 14,
wherein the recess forms an edge of the first thickness at the corner.

16. The method as in claim 15, wherein the second recessed portion of the first portion of the first metal layer protrudes beyond the first recessed portion of the first portion of the first metal layer only outside of the corner defined by the recess of the first recessed portion of the first portion of the first metal layer.

17. The method as in claim 15, wherein the recess of the first recessed portion of the first portion of the first metal layer defines a straight line connected to adjacent edges at obtuse angles.

18. The method as in claim 17, wherein a distance across a surface of the second recessed portion of the first portion of the first metal layer extended beyond the corner is between about 0.3 mm and 0.7 mm.

19. The method as in claim 15, wherein the recess of the first recessed portion of the first portion of the first metal layer defines a rounded edge.

20. A method, comprising:
receiving a direct bonded metal (DBM) substrate, the DBM substrate including:
a dielectric layer having a first side and a second side opposite the first side; and
a first metal layer bonded to the first side of the dielectric layer;
performing a recess operation on a first portion of the first metal layer to produce a first recessed portion of the first portion of the first metal layer, the first recessed portion having a first thickness; and
performing a plating operation on the first recessed portion of the first portion of the first metal layer to produce a second recessed portion of the first portion of the first metal layer, the second recessed portion having a second thickness, the second thickness being less than the first thickness.

* * * * *